United States Patent
Srinivasan et al.

(10) Patent No.: US 12,399,218 B2
(45) Date of Patent: Aug. 26, 2025

(54) PORs TESTING IN MULTIPLE POWER DOMAIN DEVICES

(71) Applicant: STMicroelectronics International N.V., Geneva (CH)

(72) Inventors: Venkata Narayanan Srinivasan, Greater Noida (IN); Mayankkumar Hareshbhai Niranjani, Lathi (IN); Gourav Garg, Kaithal (IN)

(73) Assignee: STMicroelectronics International N.V., Geneva (CH)

( * ) Notice: Subject to any disclaimer, the term of this patent is extended or adjusted under 35 U.S.C. 154(b) by 283 days.

(21) Appl. No.: 18/165,602

(22) Filed: Feb. 7, 2023

(65) Prior Publication Data

US 2024/0264229 A1 Aug. 8, 2024

(51) Int. Cl.
*G01R 31/317* (2006.01)
*H03K 19/0175* (2006.01)

(52) U.S. Cl.
CPC .......... *G01R 31/31721* (2013.01); *H03K 19/017509* (2013.01)

(58) Field of Classification Search
CPC ........ G01R 31/318575; G01R 31/3177; G01R 31/31721; G01R 31/318558; G01R 31/2856; G01R 31/2879; G01R 31/3008; G01R 31/31701; G01R 31/318563; G06F 1/24; G06F 1/28; G06F 1/3287; G06F 1/26; G06F 1/263; G06F 1/30; G06F 1/3203; G06F 1/3234; G06F 1/3296; G06F 1/3275; G06F 30/398; H03K 19/20; H03K 17/22; H03K 17/223; H03K 19/017509; H03K 17/162; H03K 19/00361; H03K 19/018507; H03K 19/0016; H03K 19/003; H03K 19/0185; H03K 19/018521; H03K 5/19
See application file for complete search history.

(56) References Cited

U.S. PATENT DOCUMENTS

| | | | |
|---|---|---|---|
| 8,629,713 B2 | 1/2014 | Pietri et al. | |
| 9,471,120 B1 | 10/2016 | Thakur et al. | |
| 9,690,344 B2 | 6/2017 | Damle et al. | |
| 9,698,771 B1 * | 7/2017 | Srinivasan | G06F 1/24 |
| 9,941,875 B2 | 4/2018 | Srinivasan et al. | |

(Continued)

FOREIGN PATENT DOCUMENTS

EP     2232706 B1     11/2015

OTHER PUBLICATIONS

European Extended Search Report, EP Application No. 24151326.6-1218, mailed Jun. 14, 2024, 10 pages.

*Primary Examiner* — Lincoln D Donovan
*Assistant Examiner* — Tyler J Pereny
(74) *Attorney, Agent, or Firm* — Slater Matsil, LLP

(57) ABSTRACT

According to an embodiment, a method for testing multiple power-on-resets in a system-on-chip with a multi-power domain architecture operating under a dual power flow mode is provided. The method includes powering up the system-on-chip to full power mode, decoupling a third power domain from a first power domain and a second power domain, monitoring a general purpose input/output (GPIO) pad of the third power domain during a ramping down of a supply of the third power domain, and detecting a logic transition at the GPIO pad of the third power domain corresponding to a trip-point of the power-on-reset of the third power domain.

20 Claims, 10 Drawing Sheets

(56) References Cited

U.S. PATENT DOCUMENTS

| | | |
|---|---|---|
| 10,193,545 B1 | 1/2019 | Pankratz et al. |
| 10,601,217 B2 | 3/2020 | Batenburg et al. |
| 10,734,993 B2 | 8/2020 | Kowkutla et al. |
| 10,747,282 B2 | 8/2020 | Srinivasan et al. |
| 10,996,266 B2 | 5/2021 | Srinivasan et al. |
| 11,054,888 B2 | 7/2021 | Kim et al. |
| 11,119,153 B1 | 9/2021 | Srinivasan |
| 11,340,292 B2 | 5/2022 | Narwal et al. |
| 11,498,328 B2 | 11/2022 | Linn et al. |
| 11,513,544 B1 | 11/2022 | Srinivasan et al. |
| 11,550,348 B2 * | 1/2023 | Srinivasan ............... G05F 1/562 |
| 2003/0062552 A1 | 4/2003 | Takata |
| 2007/0170960 A1 | 7/2007 | Sakai et al. |
| 2019/0086474 A1 | 3/2019 | Srinivasan et al. |
| 2019/0094301 A1 | 3/2019 | Srinivasan et al. |
| 2022/0308610 A1 | 9/2022 | Srinivasan et al. |

\* cited by examiner

PORs TESTING IN MULTIPLE POWER DOMAIN DEVICES

TECHNICAL FIELD

The present disclosure generally relates to an electronic device and, in particular embodiments, to power-on-reset (POR) testing in multiple power domain devices.

BACKGROUND

Systems on a chip may include multiple power domains, such as a RUN mode, a low-power, and a standby (or always-on) power domain. The device may switch between the different power domains to achieve energy efficiency. The standby power domain has very low power consumption and remains ON after the device is powered up. This allows the device to enter standby mode until, for example, a user's input triggers an end to the standby mode. The low-power power domain allows the device to operate in low-power mode—the low-power power domain is OFF in the standby mode. This allows the device to perform certain functions at reduced power consumption. The RUN mode power domain is typically used for performing full-power operations when the maximum performance of the device is required. The RUN power domain is OFF in the low-power and standby modes.

Power-on-reset (POR) is commonly used to automatically reset a device or a region of a device. Power-on-reset is the first reset source, which gates all other reset sources within the device or at a particular region. Power-on-reset allows the device to start in a known, stable state and prevents it from operating in an unknown or undefined state.

Testing a power-on-reset trip point (i.e., threshold check) is mandatory to ensure correct device functionality. In an electronic device with a multi-power domain operating in a dual power flow mode, each power domain includes an associated power-on-reset. This is in contrast to the conventional electronic device with a multi-power domain operating in a single-power follow mode or an electronic device with a single-power domain, where the electronic device operates with a single power-on-reset only, for example, in the standby power domain. A method, circuit, and system to test the various power-on-resets in an electronic device with a multi-power domain operating in a dual power flow are, thus, desirable.

SUMMARY

Technical advantages are generally achieved by embodiments of this disclosure which describe the power-on-reset testing in multiple power domain devices.

A first aspect relates to a method for testing multiple power-on-resets in a system-on-chip with a multi-power domain architecture operating under a dual power flow mode. The method includes powering up the system-on-chip to full power mode, decoupling a third power domain from a first power domain and a second power domain, monitoring a general purpose input/output (GPIO) pad of the third power domain during a ramping down of a supply of the third power domain, and detecting a logic transition at the GPIO pad of the third power domain corresponding to a trip-point of the power-on-reset of the third power domain.

In a first implementation form of the method according to the first aspect as such, the method further includes decoupling the second power domain from the first power domain, monitoring a GPIO pad of the first power domain during a ramping down of a supply of the second power domain, and detecting a logic transition at the GPIO pad of the first power domain corresponding to a power-on-reset trip-point of the second power domain.

In a second implementation form of the method according to the first aspect as such or any preceding implementation form of the first aspect, the method further includes monitoring a second GPIO pad of the first power domain during a ramping down of a supply of the first power domain and detecting a logic transition at the second GPIO pad of the first power domain corresponding to a trip-point of the power-on-reset of the first power domain.

In a third implementation form of the method according to the first aspect as such or any preceding implementation form of the first aspect, a supply of the second power domain and a supply of the first power domain remains stable during the ramping down of the supply of the third power domain.

In a fourth implementation form of the method according to the first aspect as such or any preceding implementation form of the first aspect, the system-on-chip with the multi-power domain architecture operating under dual power flow mode has a first power flow direction during a power up or a reset sequence different from a second power flow direction during an exiting of a standby mode.

In a fifth implementation form of the method according to the first aspect as such or any preceding implementation form of the first aspect, the first power flow direction is a sequential powering up of the third power domain, the second power domain, and the first power domain.

In a sixth implementation form of the method according to the first aspect as such or any preceding implementation form of the first aspect, the second power flow direction is a sequential powering up of the second power domain and the third power domain, wherein the first power domain remains on during the standby mode.

In a seventh implementation form of the method according to the first aspect as such or any preceding implementation form of the first aspect, the third power domain is used to perform full-power operations of the system-on-chip, the second power domain is used to perform low-power operations of the system-on-chip, and the first power domain is used to enter the system-on-chip into a standby mode.

A second aspect relates to a system-on-chip. The system-on-chip includes a first power domain for operating the system-on-chip in a standby mode, the first power domain comprising a first switch, a second power domain for operating the system-on-chip in a low-power mode, the first switch configured to couple the first power domain to the second power domain, the second power domain comprising a second switch, a third power domain for operating the system-on-chip in a full operation mode, the second switch configured to couple the third power domain to the second power domain and the first switch configured to couple the second power domain to the first power domain. The third power domain includes a first level shifter and a second level shifter. The first level shifter is configured to generate a control signal with a logic level high in response to a supply of the third power domain being greater than a first threshold, the system-on-chip being fully powered up, and the second switch being in an open position, and generate the control signal with a logic level low in response to the supply of the third power domain being less than the first threshold, the system-on-chip being powered up in the first power domain and the second power domain and unpowered in the third power domain, and the second switch being in the open position. The second level shifter is configured to receive the control signal, generate an output signal with a logic level low in response to the control signal having a logic level high, and generate an output signal with a logic level high in response to the control signal having a logic level low.

In a first implementation form of the system-on-chip according to the second aspect as such, the system-on-chip includes a GPIO pad coupled to an output of the second level shifter. By monitoring a transition from the logic level low to a logic level high at the GPIO pad during a ramping down of the supply of the third power domain, a power-on-reset trip point of the supply of the third power domain is detected.

In a second implementation form of the system-on-chip according to the second aspect as such or any preceding implementation form of the second aspect, the second power domain includes a third level shifter configured to generate an output signal with a logic level high in response to a supply of the second power domain being greater than a second threshold, and generate an output signal with a logic level low in response to a supply of the second power domain being less than the second threshold.

In a third implementation form of the system-on-chip according to the second aspect as such or any preceding implementation form of the second aspect, the system-on-chip further includes a GPIO pad coupled to an output of the third level shifter, wherein by monitoring a transition from the logic level high to a logic level low at the GPIO pad during a ramping down of the supply of the second power domain, a power-on-reset trip point of the supply of the second power domain is detected.

In a fourth implementation form of the system-on-chip according to the second aspect as such or any preceding implementation form of the second aspect, the first power domain includes a fourth level shifter and a fifth level shifter. The fourth level shifter is configured to generate a second control signal with a logic level high in response to a power-on-reset of the first power domain being greater than a third threshold, and generate the second control signal with a logic level low in response to the power-on-reset of the first power domain being less than the third threshold. The fifth level shifter is configured to receive the second control signal, generate an output signal with a logic level low in response to the second control signal having a logic level high, and generate an output signal with a logic level high in response to the second control signal having a logic level low.

In a fifth implementation form of the system-on-chip according to the second aspect as such or any preceding implementation form of the second aspect, the system-on-chip further includes a GPIO pad coupled to an output of the fifth level shifter. By monitoring a transition from the logic level low to a logic level high at the GPIO pad during a ramping down of the supply of the first power domain, a power-on-reset trip point of the supply of the first power domain is detected.

A third aspect relates to a method for testing multiple power-on-resets in a system-on-chip with a multi-power domain architecture operating under a dual power flow mode. The method includes having a first power domain for operating the system-on-chip in a standby mode, the first power domain comprising a first switch, having a second power domain for operating the system-on-chip in a low-power mode, the first power domain couplable to the second power domain using the first switch, and the second power domain comprising a second switch, having a third power domain for operating the system-on-chip in a full operation mode, the third power domain couplable to the second power domain using the second switch and further couplable to the first power domain using the first switch, operating the system-on-chip in a power-on-reset test mode, opening the second switch to decouple the third power domain from the first power domain and the second power domain during full power up of the system-on-chip, loading a test data register with a bit having logic level high, ramping down of a supply of the third power domain, and detecting a logic level transition at an output of a first level shifter, the first level shifter coupled to an inverted value of the test data register and controlled by a control signal generated by a second level shifter, the second level shifter generating a first control signal in response to the supply of the third power domain being greater than a threshold and generating a second control signal in response to the supply of the third power domain being less than the threshold.

In a first implementation form of the method according to the third aspect as such, the detecting the logic level transition at the output of the first level shifter corresponds to a power-on-reset trip point of the supply of the third power domain.

In a second implementation form of the method according to the third aspect as such or any preceding implementation form of the third aspect, the method further includes opening the first switch to decouple the second power domain from the first power domain, ramping down of a supply of the second power domain, and detecting a logic level transition at an output of a third level shifter, the third level shifter generating a first output signal with a logic level high in response to the supply of the second power domain being greater than a second threshold and generating a second output signal with a logic level low in response to a supply of the second power domain being less than the second threshold.

In a third implementation form of the method according to the third aspect as such or any preceding implementation form of the third aspect, the detecting the logic level transition at the output of the third level shifter corresponds to a power-on-reset trip point of the supply of the second power domain.

In a fourth implementation form of the method according to the third aspect as such or any preceding implementation form of the third aspect, the method further includes loading a second test data register with a bit having logic level high, ramping down of a supply of the first power domain, and detecting a logic level transition at an output of a fourth level shifter, the fourth level shifter coupled to an inverted value of the second test data register and controlled by a second control signal generated by a fifth level shifter, the fifth level shifter generating a third control signal in response to the supply of the first power domain being greater than a third threshold and generating a fourth control signal in response to the supply of the first power domain being less than the third threshold.

In a fifth implementation form of the method according to the third aspect as such or any preceding implementation form of the third aspect, the detecting the logic level transition at the output of the fourth level shifter corresponds to a power-on-reset trip point of the supply of the first power domain.

Embodiments can be implemented in hardware, software, or in any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Figure 1:
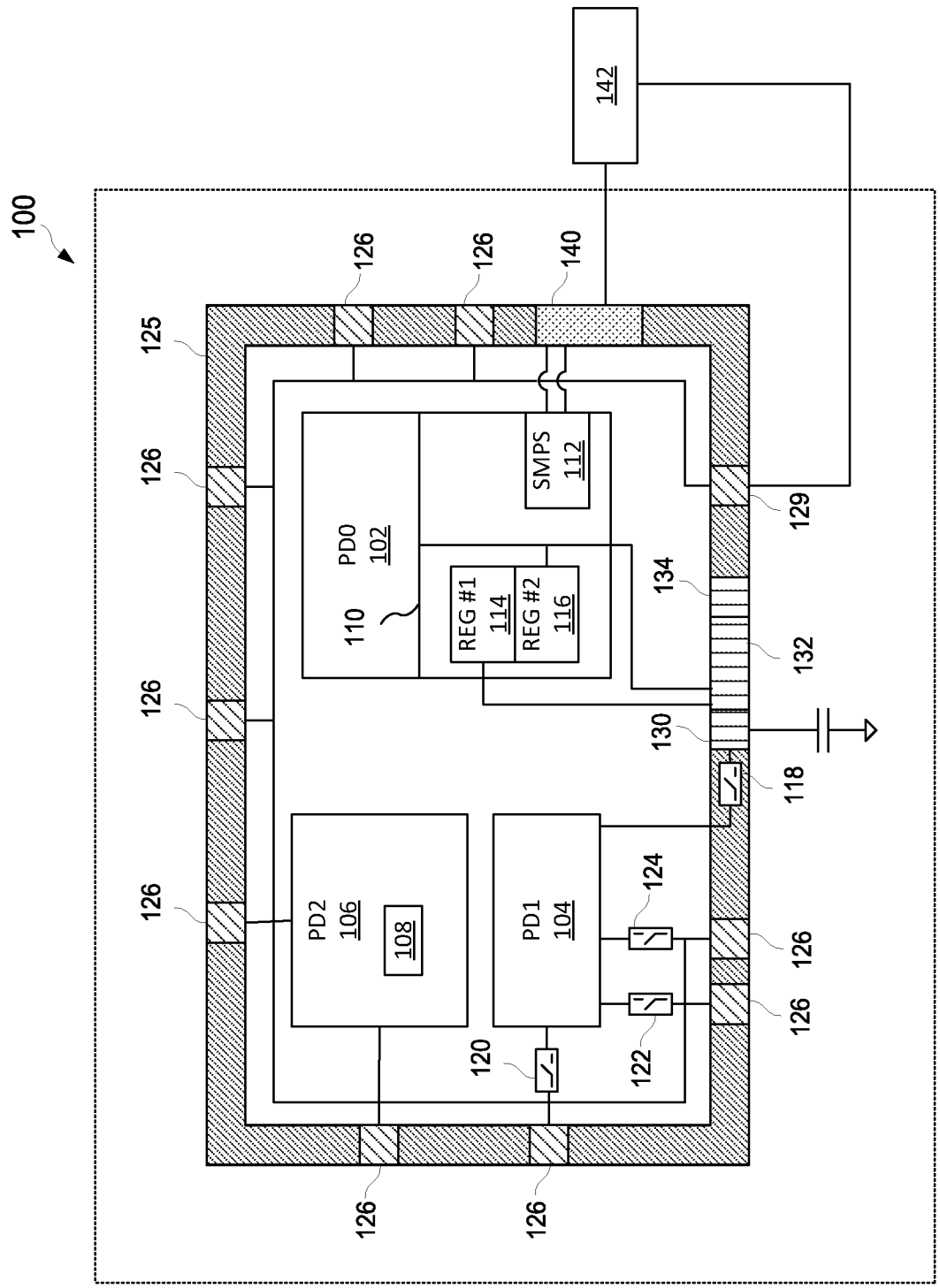
FIG. 1 is a block diagram of an embodiment system-on-chip (SoC)

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of an electronic device with a multiple power domain of a quantity of three power domains, it should also be appreciated that these inventive aspects may also apply to an electronic device with a multiple power domain of any quantity of power domains.

In embodiments, a method, circuit, and system are provided for testing multiple power-on-resets in a system-on-chip with a multi-power domain architecture operating under a dual power flow mode.

Aspects of the disclosure include a system-on-chip that includes a first power domain, a second power domain, and a third power domain. The first power domain is used by the system-on-chip for operating in a standby mode. The second power domain is used by the system-on-chip for operating in a low-power mode. The third power domain is used by the system-on-chip for operating in a full operation mode.

The first power domain includes a first switch. The second power domain includes a second switch. The first switch is configured to couple the first power domain to the second power domain and the second power domain to the first power domain. The second switch is configured to couple the third power domain to the second power domain. The third power domain includes a first level shifter and a second level shifter.

The first level shifter is configured to generate a control signal with a logic level high in response to (i) a supply of the third power domain being greater than a first threshold, (ii) the system-on-chip being fully powered up, (iii) and the second switch being in an open position.

The first level shifter is further configured to generate the control signal with a logic level low in response to (i) the supply of the third power domain being less than the first threshold, (ii) the system-on-chip being powered up in the first power domain and the second power domain and unpowered in the third power domain, and (iii) the second switch being in the open position.

The second level shifter is configured to receive the control signal and generate an output signal with a logic level low in response to the control signal having a logic level high. The second level shifter is further configured to generate an output signal with a logic level high in response to the control signal having a logic level low.

In embodiments, the system-on-chip includes a GPIO pad coupled to an output of the second level shifter. By monitoring a transition from the logic level low to a logic level high at the GPIO pad during a ramping down of the supply of the third power domain, a power-on-reset trip point of the supply of the third power domain is detected.

In another embodiment, the second power domain includes a third level shifter configured to generate an output signal with a logic level high in response to a supply of the second power domain being greater than a second threshold, and generate an output signal with a logic level low in response to a supply of the second power domain being less than the second threshold.

In yet another embodiment, the system-on-chip further includes a GPIO pad coupled to an output of the third level shifter. By monitoring a transition from the logic level high to a logic level low at the GPIO pad during a ramping down of the supply of the second power domain, a power-on-reset trip point of the supply of the second power domain is detected.

In yet another embodiment, the first power domain includes a fourth level shifter and a fifth level shifter. The fourth level shifter is configured to generate a second control signal with a logic level high in response to a power-on-reset of the first power domain being greater than a third threshold, and generate the second control signal with a logic level low in response to the power-on-reset of the first power domain being less than the third threshold. The fifth level shifter is configured to receive the second control signal, generate an output signal with a logic level low in response to the second control signal having a logic level high, and generate an output signal with a logic level high in response to the second control signal having a logic level low.

In yet another embodiment, the system-on-chip further includes a GPIO pad coupled to an output of the fifth level shifter. By monitoring a transition from the logic level low to a logic level high at the GPIO pad during a ramping down of the supply of the first power domain, a power-on-reset trip point of the supply of the first power domain is detected. These and other details are further detailed below.

FIG. 1 illustrates a block diagram of an embodiment system-on-chip (SoC) 100 as disclosed in U.S. Pat. No. 11,550,348, which is hereby incorporated by reference herein in its entirety. System-on-chip 100 is configured to have multiple power domains. System-on-chip 100 may be a component of an electronic device, such as a computer, a mobile phone, a home appliance, or the like. System-on-chip 100 includes a first power domain (PD0) 102, a second power domain (PD1) 104, and a third power domain (PD2) 106, which may (or may not) be arranged as shown.

Optionally, System-on-chip 100 may include a controller 108 operating in, for example, the third power domain 106—to minimize taxing resources of the first power domain 102 and second power domain 104.

Also shown are RUN mode switch 120, 122, and 124, and a low-power switch 118. RUN mode switches 120, 122, and 124 are arranged between the third power domain 106 and the second power domain 104. The low-power switch 118 is arranged between the first power domain 102 and the second power domain 104. It should be appreciated that when the RUN mode switches 120, 122, and 124, and low-power switch 118 are closed, all three low-voltage power domains effectively behave as a single low-voltage power domain.

System-on-chip 100 100 may include a ring pad 125 where the I/O pads of the system-on-chip 100 are located. Power supply pads 126 on the ring pad 125 correspond to supply pads for the third power domain 106. System-on-chip 100 may include additional components not shown in FIG. 1. Further, system-on-chip 100 may have other power domains or supplies (not shown). The number of I/O pads illustrated in FIG. 1 for system-on-chip 100 is non-limiting, and embodiments with fewer or greater pads are similarly contemplated.

First power domain 102, second power domain 104, and third power domain, may collectively be referred to as the power domains of the system-on-chip 100. Each power domain may include its respective electrical components or circuits that perform certain functions. Each of the first power domain 102, second power domain 104, and third power domain 106 may operate on a low-voltage (LV) supply. First power domain 102 also includes a high-voltage (HV) supply to provide the various low-voltage supplies in the different power domains in one configuration of the system-on-chip 100.

The first power domain 102 can also be referred to as a standby power domain, an ultra-low-power (ULP) power domain, or an always-on power domain. The first power domain 102 is powered on during a standby mode of system-on-chip 100. In embodiments, the first power domain 102 monitors user input during the standby mode, and in response to, for example, detecting a user input, exits the standby mode and enters into low power mode or RUN mode.

The second power domain 104 can also be referred to as a low-power (LP) power domain. The second power domain 104 may be powered off during the standby mode of system-on-chip 100 when the first power domain 102 is powered on. In embodiments, the second power domain 104 may perform certain functions at reduced power consumption in the low-power (LP) power mode. In the low-power power mode, the first power domain 102 and the second power domain 104 are powered on, and the third power domain 106 is powered off.

The third power domain 106 can also be referred to as a RUN mode power domain or a switchable power domain. Third power domain 106 may be powered off during the standby mode of system-on-chip 100 when the first power domain 102 is powered on and the second power domain 104 is powered off. Third power domain 106 may be switchably powered on or powered off at other times. In embodiments, the third power domain 106 may be used for performing a full-power operation in the RUN mode when the maximum performance of the system-on-chip 100 is required. System-on-chip 100 100 may exit the low-power mode to enter the RUN mode. In the RUN mode, the first power domain 102, the second power domain 104, and the third power domain 106 are all powered on.

In embodiments, a power domain is said to be powered on, or being powered, when a supply voltage is provided to the power domain to turn on (e.g., providing the supply voltage) circuits operating within the power domain. When a power domain no longer receives the supply voltage, the power domain is said to be powered off, turned off, or not powered.

In embodiments, the first power domain 102 includes a power management unit (PMU) 110. The power management unit 110 may include a switched-mode power supply (SMPS) 112 (e.g., buck converter, boost converter, etc.), a first regulator 114, and a second regulator 116.

Switched-mode power supply 112 is switched on and off alternately by a respective control signal (e.g., a pulse-width modulated (PWM) control signal) to provide a supply voltage. Switched-mode power supply 112 may supply power to the first power domain 102, the second power domain 104, and the third power domain 106. In embodiments, the first regulator 114 is powered off in response to the switched-mode power supply 112 powering the first power domain 102 and the second power domain 104.

In embodiments, the first regulator 114 is a linear voltage regulator configured to provide a low voltage supply. The first regulator 114 may have a ballast 132 located in the ring pad 125 of system-on-chip 100—ballast 132 is internal to the ring pad 125. In embodiments, ballast 132 includes a low-voltage (LV) supply pad 130 and a pad 134. Low-voltage (LV) supply pad 130 may be coupled with a low-voltage supply package pin. Pad 134 may be coupled with a high-voltage supply package pin.

In embodiments, the second regulator 116 is a linear regulator configured to provide an ultra-low voltage supply. The second regulator 116 may power the first power domain 102 during a standby mode of system-on-chip 100. The second regulator 116 may have its loop closed within the power management unit 110. A ballast for the second regulator 116 may be located within the power management unit 110. In embodiments, the second regulator 116 is powered on only during the standby mode of system-on-chip 100.

In embodiments, the first power domain 102 receives power from the low-voltage (LV) supply pad 130. In embodiments, the third power domain 106 receives power from the power supply pads 126. In embodiments, the second power domain 104 receives power through the first power domain 102, the third power domain 106, or both the first power domain 102 and the third power domain 106 depending on the configuration of the low-power switch 118 and RUN mode switches 120, 122, and 124. The low-power switch 118 and the RUN mode switches 120, 122, and 124 are controlled through respective pads within the first power domain 102, which is always on once the device is powered up (i.e., allowing the switches to open and close regardless of whether the second power domain 104 or third power domain 106 are powered up).

The second power domain 104 is decoupled from the first power domain 102 and the third power domain 106 in response to the low-power switch 118 and RUN mode switches 120, 122, and 124 being in an open position. In this configuration, the second power domain 104 is powered off.

In response to the low-power switch 118 being closed and RUN mode switches 120, 122, and 124 being open, the first power domain 102 is coupled to the second power domain 104, and the first regulator 114 may be powering both the first power domain 102 and the second power domain 104. It should be appreciated that additional switches may be used to couple the first power domain 102 and the second power domain 104.

In response to the low-power switch 118 being open and RUN mode switches 120, 122, and 124 being in a closed position, the third power domain 106 is coupled to the second power domain 104, such that the switched-mode power supply 112 provides a supply voltage to both power domains. In embodiments, RUN mode switches 120, 122, and 124 are in a closed position in response to the switched-mode power supply 112 is powered. Although system-on-chip 100 is shown to have three RUN mode switches 120, 122, and 124, the number of RUN mode switches are non-limiting, and fewer or greater RUN mode switches may be included in other embodiments.

Finally, in response to the low-power switch 118 and the RUN mode switches 120, 122, and 124 being in a closed position, the second power domain 104 is coupled to the first power domain 102 and the third power domain 106. In this configuration, switched-mode power supply 112 provides a supply voltage to the third power domain 106, the second power domain 104 (through the RUN mode switches 120, 122, and 124), and the first power domain 102 (through the low-power switch 118).

In embodiments, controller 108 is used to control the operation (open or closed position) of the low-power switch 118 and the RUN mode switches 120, 122, and 124. In embodiments, the low-power switch 118 and the RUN mode switches 120, 122, and 124 are configured to be closed in response to no high voltage (HV) supply being made available to the switched-mode power supply 112. In embodiments, controller 108 controls the operation of the first regulator 114 and the second regulator 116.

In embodiments, the switched-mode power supply 112 of the system-on-chip 100 is coupled to an external (e.g., off-chip component) circuit 142 through pad 140. Circuit 142 may include, for example, a ballast, an inductor, and a capacitor. In response to the system-on-chip 100 being coupled to circuit 142, the switched-mode power supply 112 provides a voltage supply at a package pin coupled to power supply pad 129, which is coupled to power supply pads 126 through a power bar (between the package and the die of system-on-chip 100). Thus, the switched-mode power supply 112 can (i) power the third power domain 106 and (ii) power the second power domain 104 and the first power domain 102 (depending on the configuration of the low-power switch 118 and the RUN mode switches 120, 122, and 124).

Figure 2:
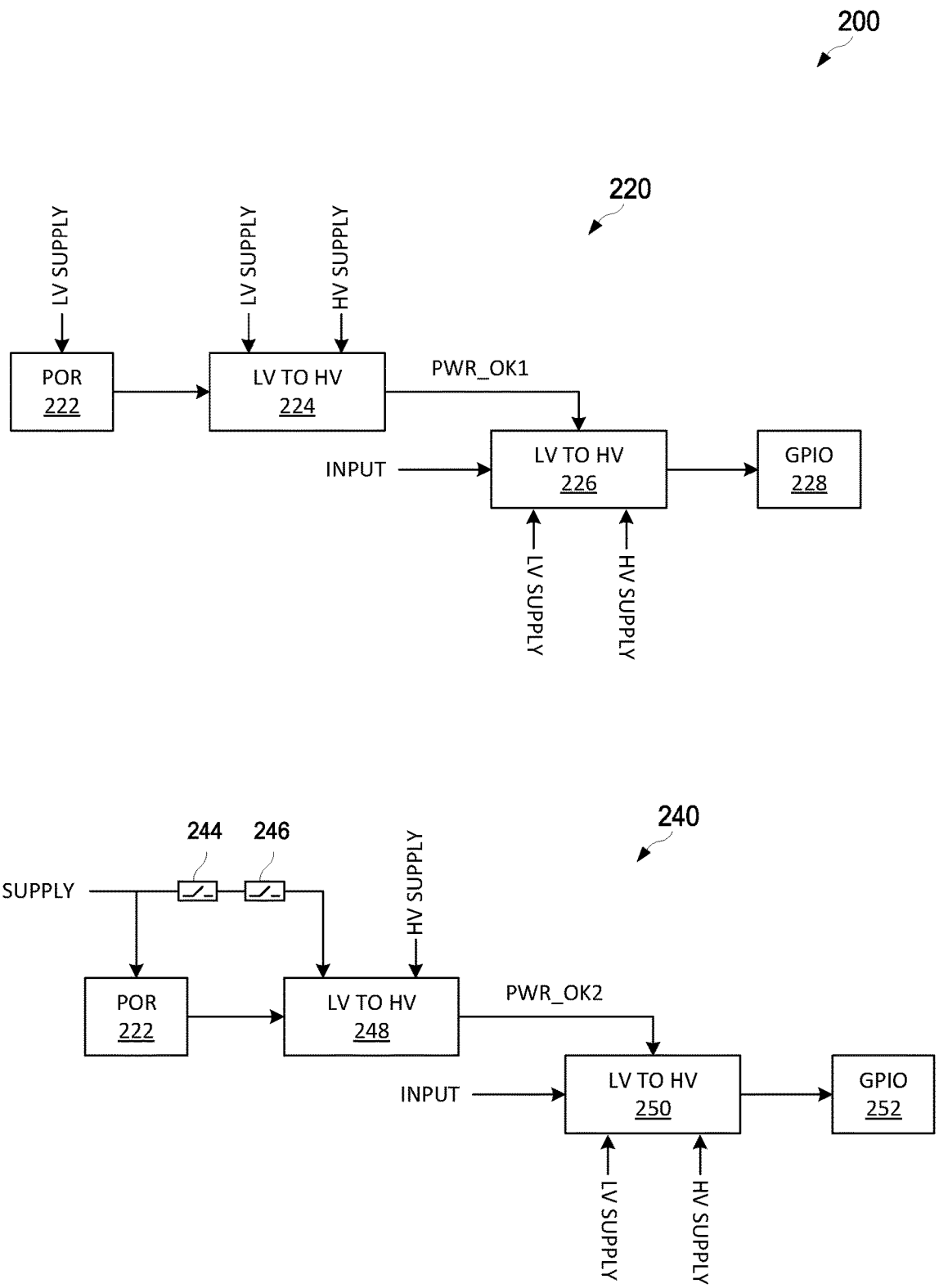
FIG. 2 is a block diagram of a circuit for testing the power-on-reset of a system-on-chip having a multi-power domain architecture that operates under a single power flow direction during either boot-up or exiting from standby mode.

FIG. 2 illustrates a block diagram of a circuit 200 for testing the power-on-reset of a system-on-chip having a multi-power domain architecture that operates under a single power flow direction during either boot-up or exiting from standby mode. Conventionally, the power flow direction during boot-up is the same as the power flow direction during an exiting from standby mode.

For example, for a system-on-chip having a multi-power domain architecture that operates under a single power flow direction, the boot-up sequence includes sequentially powering up the first power domain 102 (e.g., entering into standby mode), then the second power domain 104 (e.g., entering into low-power mode), and finally the third power domain 106 (e.g., entering into RUN mode). When the system-on-chip transitions from RUN mode to low-power mode, the third power domain 106 is powered off. Next, when the device transitions from the low-power mode to the standby mode, the second power domain 104 is powered off. The transition from standby mode to RUN mode includes first powering the second power domain (e.g., entering into low-power mode) and then powering the third power domain (e.g., entering into RUN mode) sequentially.

As the conventional system-on-chip has a single power flow direction, the electronic device includes only a single power-on-reset 222, which monitors the first power domain supply and controls (i.e., signal out) the power voltage status to the third power domain pads (e.g., GPIO pad 252 and other GPIO pads of the third power domain 106 and GPIO pad 228 and other GPIO pads of the first power domain 102). In embodiments, the control signal (PWR_OK2) is coupled to all LV to HV level shifters before all GPIO pads of the third power domain 106. In embodiments, control signal (PWR_OK1) is coupled to all LV to HV level shifters before all GPIO pads of the first power domain 102

In embodiments, circuit 200 includes a first sub-circuit 220 and a second sub-circuit 240. The first sub-circuit 220 is used to test the single power-on-reset 222 in the first power domain 102 and the second sub-circuit 240 is used to test the single power-on-reset 222 in the third power domain 106.

The first sub-circuit includes a single power-on-reset 222, a first level shifter 224, a second level shifter 226, and a GPIO pad 228. The second sub-circuit 240 includes a single power-on-reset 222, a first switch 244, a second switch 246, a third level shifter 248, a fourth level shifter 250, and a GPIO pad 252. Thus, single power-on-reset 222 can be checked at GPIO pad 228 within the first power domain 102, and at GPIO pad 252 in the third power domain 106 when both first switch 244 and second switch 246 are in a closed position.

In embodiments, the first switch 244 in circuit 200 is mapped to the low-power switch 118 in the system-on-chip 100. In embodiments, the second switch 246 in circuit 200 is mapped to the RUN mode switches 120, 122, and 124 in the system-on-chip 100. It is noted that, although multiple RUN mode switches are shown in FIG. 1, the number of switches is reduced to one in FIG. 2 for simplicity of the discussion. Thus, the number of RUN mode switches is non-limiting, and fewer or greater than three switches are contemplated in embodiments. Further, although a single low-power switch 118 is shown in the various figures, the number of switches is non-limiting, and a greater number of switches may also be contemplated.

The testing of the power-on-reset for a system-on-chip having a multi-power domain architecture that operates under a single power flow direction using circuit 200 includes (i) closing the first switch 244 and the second switch 246 and (ii) powering up the first power domain 102, the second power domain 104, and the third power domain 106. This configuration effectively makes the system-on-chip operate as a single power domain device.

In embodiments, circuits operating within, for example, each of the third and the first power domains include an IP that interfaces (e.g., Controller Area Network (CAN), Local Interconnect Network (LIN), etc.) with the external component through a respective general-purpose input/output (GPIO) pad after being level shifted by the level shifter coupled between the IP and the GPIO. The GPIO is only operable when activated by the control signal (PWR_OK). The control signal (PWR_OK) is only activated when the single power-on-reset in the first power domain 102 is asserted (i.e., above a threshold), regardless of the domain in which the IP is interfacing with the GPIO. It is noted that there are no GPIO pads in the second power domain 104.

The single power-on-reset 222 is coupled to the low-voltage (LV) supply of the system-on-chip 100—the low-voltage (LV) supply is the common low-voltage supply common to all power domains when all power domains are powered up. Further, each level shifter 224, 226, 248, and 250 has a first input (i.e., a first transistor of the level shifter) coupled to the low-voltage (LV) supply and a second input (i.e., a second transistor of the level shifter) coupled to a high-voltage (HV) supply.

Regarding the first sub-circuit 220, the low-voltage (LV) signal is received at a third input of the first level shifter 224 from the single power-on-reset 222. In embodiments, the LV signal from single power-on-reset 222 is logic high when the low-voltage supply is above the single power-on-reset threshold. In embodiments, the LV signal from the single power-on-reset 222 is logic low when the low-voltage supply is below the single power-on-reset threshold. The low-voltage supply is provided from, for example, low-voltage (LV) supply pad 130. The high-voltage supply is provided from, for example, pad 134.

The output of the first level shifter 224 is a level-shifted control signal (PWR_OK1) provided as a control signal to the second level shifter 226. The control signal (PWR_OK1) has level shifted value as a function of the voltage level at the sense input of single power-on-reset 222. In embodiments, the sense input of single power-on-reset 222 is the LV SUPPLY driven from low-voltage (LV) supply pad 130.

In embodiments, the third input of the second level shifter 226 is coupled to an output of an IP of a circuit operating within the first power domain. The output of the second level shifter 226 is coupled to the GPIO pad 228 of the system-on-chip 100. During the power-on-reset test, the value at the third input of the second level shifter 226 is forced to "0" by, for example, loading a test data register (TDR) bit through a JTAG—further detailed in FIG. 7.

Regarding second sub-circuit 240, the low-voltage (LV) signal is received at a third input of the third level shifter 248 from the single power-on-reset 222. The output of the third level shifter 248 is a control signal (PWR_OK2) for the fourth level shifter 250. In embodiments, the third input of the fourth level shifter 250 is coupled to an output of an IP of a circuit operating within the third power domain. The output of the fourth level shifter 250 is coupled to the GPIO pad 252 of the system-on-chip 100. During the power-on-reset test, the value at the third input of the fourth level shifter 250 is forced to "0".

Initially, to test the power-on-reset, the low-voltage (LV) supply at the single power-on-reset 222 is greater than or equal to a power-on-reset threshold. Thus, the first control signal (PWR_OK1) at the output of the first level shifter 224 and the second control signal (PWR_OK2) at the output of the third level shifter 248 are equal to "1". In response to the first control signal (PWR_OK1) being activated (i.e., equal to "1"), the GPIO pad 228 is operable and equal to the value forced at the third input of the second level shifter 226 or "0". Likewise, in response to the second control signal (PWR_OK2) being activated (i.e., equal to "1"), the GPIO pad 252 is operable and equal to the value forced at the third input of the fourth level shifter 250 or "0".

Next, the low-voltage (LV) is ramped down until the voltage value of the low-voltage (LV) supply is less than the power-on-reset threshold. As such, the first control signal (PWR_OK1) at the output of the first level shifter 224 and the second control signal (PWR_OK2) at the output of the third level shifter 248 transition from a value of "1" to "0", and the GPIO pad 228 and the GPIO pad 252 are pulled up (due to the HV supply having a default value to satisfy certain application requirements—using, for example, a pull-up resistor tied to the HV supply). When the GPIO pads 228 and 252 are pulled up, the value at the pads transitions from "0" to "1". Thus, the trip point for the single power-on-reset 222 is detected by monitoring the GPIO pads 228 and 252 and detecting the transition from "0" to "1". In embodiments, a test device is coupled to the GPIO pads 228 and 252 to monitor the transition from "0" to "1" to test the power-on-reset of the circuit 200.

The reader's attention is directed to U.S. Pat. Nos. 9,698,771 and 9,941,875, which are incorporated herein by reference in their entirety, for a more detailed description of conventional circuits used to test the power-on-reset of a system-on-chip having a multi-power domain architecture that operates under a single power flow direction during either boot-up or exiting from standby mode.

A detailed discussion of a system-on-chip having a multi-power domain architecture that operates under a dual power flow mode can be found in, for example, U.S. Pat. No. 11,513,544 B1, which is hereby incorporated by reference herein in its entirety.

In the dual power flow mode, the power flow direction (i.e., first power flow path) in the system-on-chip 100 during power-up or a reset (e.g., boot-up sequence or power-up sequence) is different from the power flow direction (i.e., second power flow path) when the system-on-chip 100 exits the standby mode and enters the RUN mode.

In a system-on-chip having a multi-power domain architecture that operates under dual power flow directions, the power-up or reset sequence includes sequentially powering up the third power domain 106, then the second power domain 104, and finally the first power domain 102 (i.e., first power flow path)—opposite to the single power flow direction illustrated in FIG. 2.

When the system-on-chip transitions from RUN to low-power mode, the third power domain 106 is powered off. Next, when the device transitions from the low-power mode to the standby mode, the second power domain 104 is powered off. The transition from standby to RUN mode includes first powering the second power domain (e.g., entering into low-power mode) and then powering the third power domain (e.g., entering into RUN mode) in a sequential manner (i.e., the second power flow path)—similar to the single power flow direction illustrated in FIG. 2.

Figure 3:
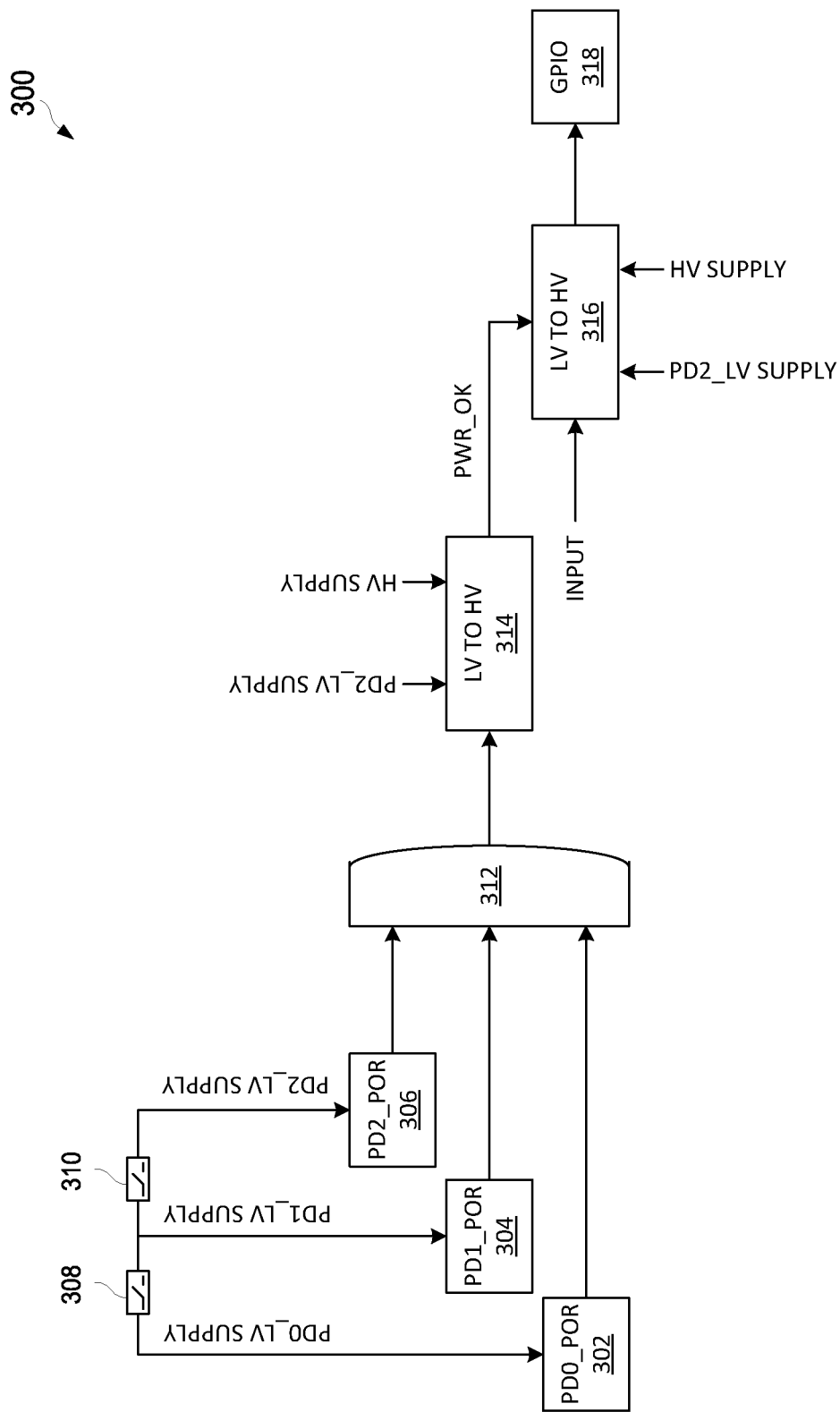
FIG. 3 is a block diagram of an embodiment power-on-reset circuit for testing the power-on-reset trip-point of the third power domain of a system-on-chip with a multi-power domain architecture operating under a dual power flow mode.
Figure 4:
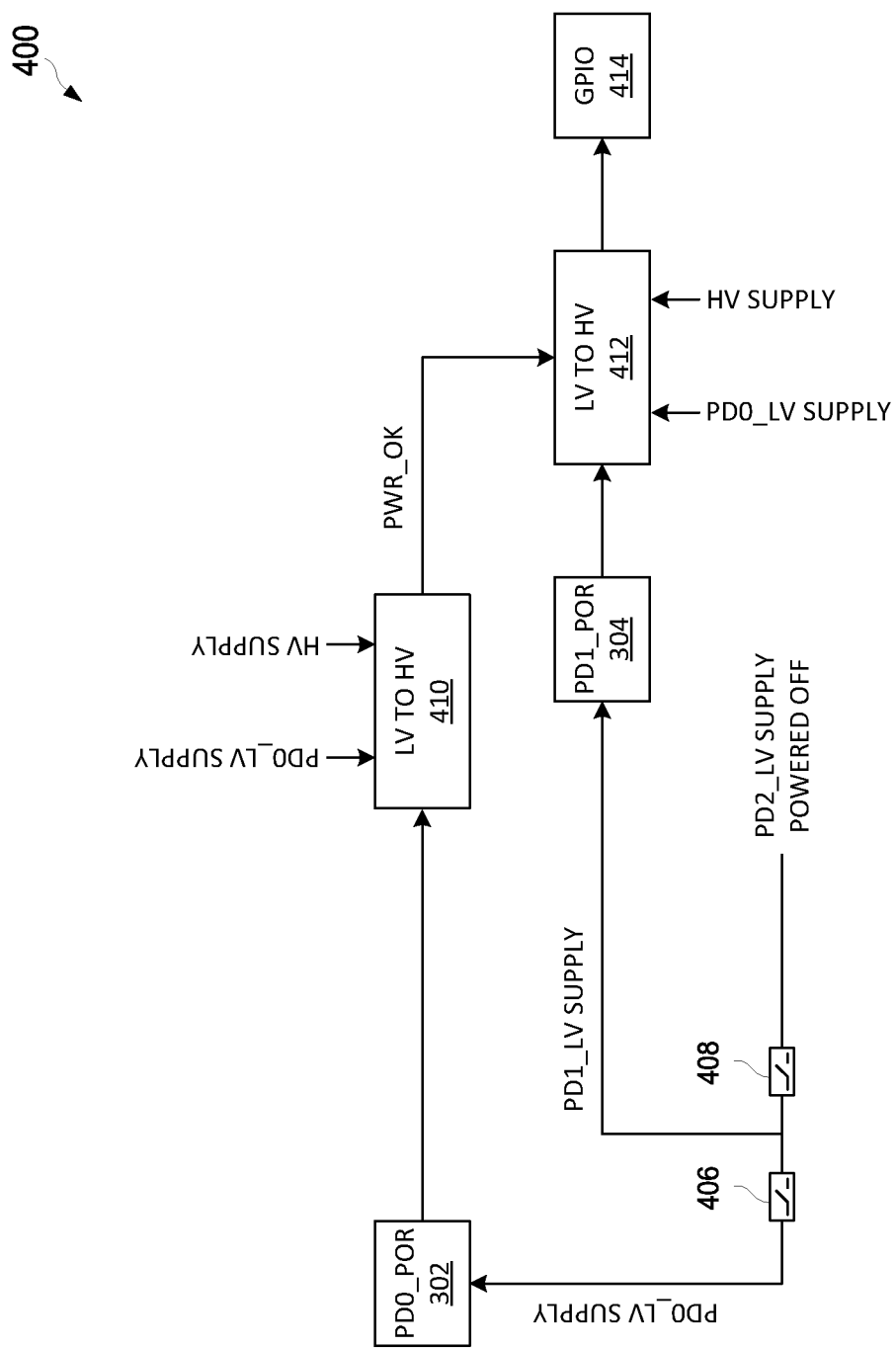
FIG. 4 is a block diagram of an embodiment power-on-reset circuit for testing the power-on-reset trip-point of the second power domain of a system-on-chip with a multi-power domain architecture operating under a dual power flow mode.
Figure 5:
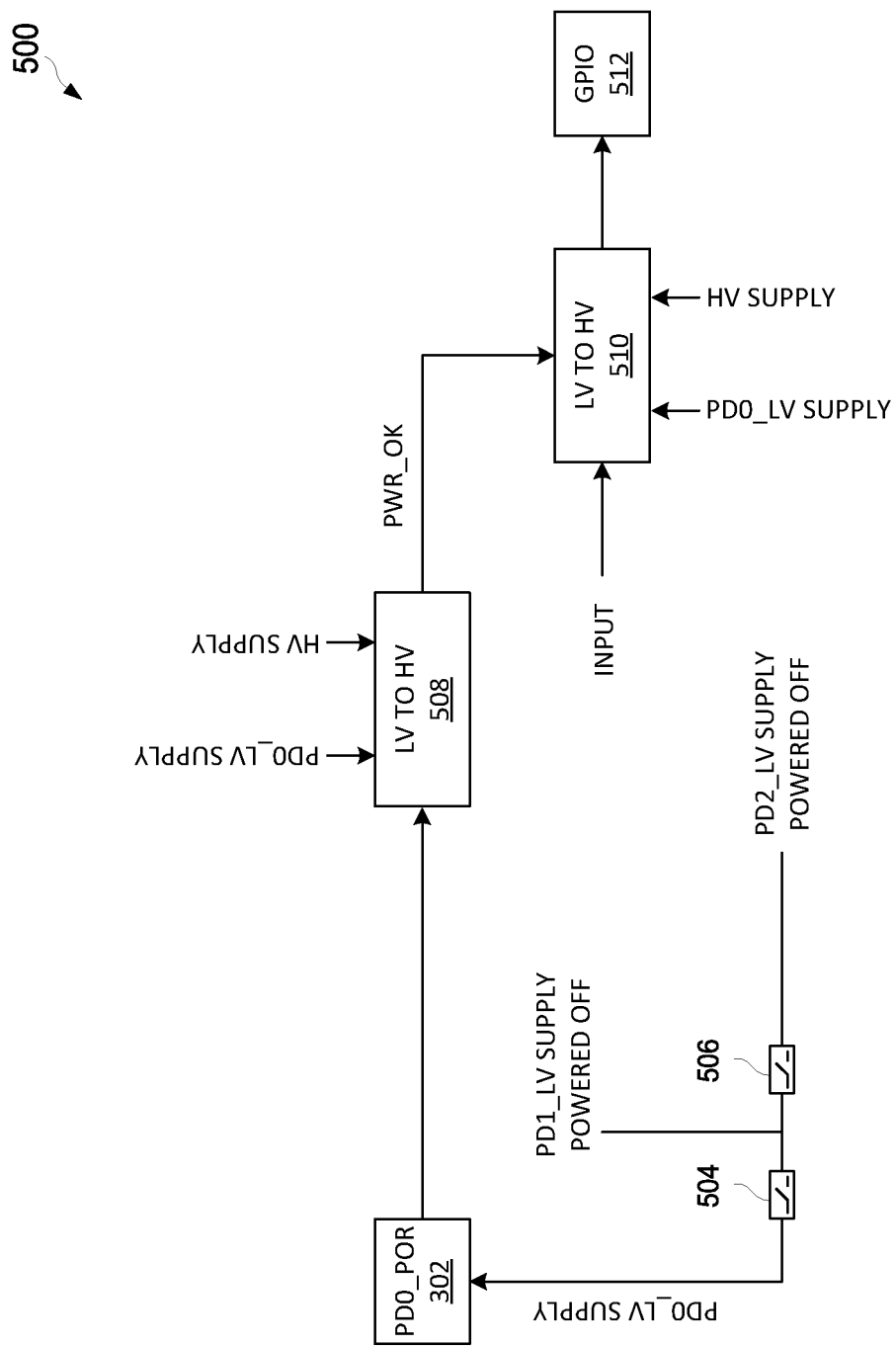
FIG. 5 is a block diagram of an embodiment power-on-reset circuit for testing the power-on-reset trip-point of the first power domain of a system-on-chip with a multi-power domain architecture operating under a dual power flow mode.

FIGS. 3-5 illustrate simplified block diagrams of embodiment power-on-reset circuits 300, 400, and 500 for testing the power-on-reset of the multiple-power domains in a system-on-chip operating under a dual power flow mode. In contrast to a system-on-chip with a single power-on-reset, in a system-on-chip with a multi-power domain architecture that operates under a dual power flow mode, each power domain includes a dedicated power-on-reset.

The GPIO corresponding to a specific power domain is only operable when activated by a dedicated control signal (PWR_OK) that depends on the supply voltage level and the power-on-reset threshold of the associated power domain. Thus, the dedicated control signal is only activated when the supply voltage level exceeds the power-on-reset threshold for the associated power domain.

In embodiments, the power-on-reset of the third power domain 106 is gated by the power-on-reset of the first power domain 102 and the second power domain 104 (i.e., it requires the power-on-reset of the first, second, and third power domains be greater than a threshold). Thus, a GPIO associated with the third power domain 106 is only operable when the power-on-resets of the first, second, and third power domains are asserted (i.e., each above the power-on-reset threshold). A GPIO associated with the first power domain 102 is operable when the power-on-reset of the first power domain 102 is asserted (i.e., above the power-on-reset threshold).

Disadvantageously, circuit 200 cannot be used to test each dedicated power-on-reset. For example, when the first switch 244 and the second switch 246 are closed, each dedicated power-on-reset senses the same low voltage (LV) supply. Further, it would be unclear which power-on-reset causes a trip point when monitoring the GPIO pad 252 and detecting the transition from "0" to "1". Moreover, monitoring the GPIO pad 228 can only determine the power-on-reset dedicated to the first power-on-domain. Embodiments of this disclosure provide a method, circuit, and system that cures these deficiencies in the prior art.

FIG. 3 illustrates a block diagram of an embodiment power-on-reset circuit 300 for testing the power-on-reset trip-point of the third power domain 106 of a system-on-chip with a multi-power domain architecture operating under a dual power flow mode. Power-on-reset circuit 300 includes a first power-on-reset 302, a second power-on-reset 304, a third power-on-reset 306, a first switch 308, a second switch 310, an AND gate 312, a first level shifter 314, a second level shifter 316, and a GPIO pad 318, which may (or may not) be arranged as shown. Power-on-reset circuit 300 may include additional components not shown.

In embodiments, the first power-on-reset 302 monitors the PD0_LV SUPPLY from low-voltage (LV) supply pad 130. In embodiments, the second power-on-reset 304 monitors the PD1_LV SUPPLY at switch outputs (i) driven from low-voltage (LV) supply pad 130 when the first switch 308 is closed and the second switch 310 is open, (ii) driven from power supply pads 126 when the first switch 308 is open and the second switch 310 is closed, or (iii) driven from both low-voltage (LV) supply pad 130 and power supply pads 126 when both first switch 308 is closed and the second switch 310 is closed. In embodiments, the third power-on-reset 306 monitors the PD2_LV SUPPLY from power supply pads 126.

Power-on-reset circuit 300 allows the detection of the trip point of the power-on-reset of the third power domain 106 by monitoring the GPIO pad 318. In embodiments, the first switch 308 is mapped to the low-power switch 118 in the system-on-chip 100. In embodiments, the second switch 310 is mapped to the RUN mode switches 120, 122, and 124 in the system-on-chip 100. It is noted that, although multiple RUN mode switches are shown in FIG. 1, the number of switches is reduced to one in FIG. 3 for simplicity of the discussion.

In embodiments, the first power-on-reset 302 is coupled to the low-voltage (LV) supply pad 130 of the first power domain 102 (PD0_LV Supply). The second power-on-reset 304 is coupled to the low-voltage (LV) supply at the switch outputs (i.e., between the first switch 308 and the second switch 310) of the second power domain 104 (PD1_LV Supply). In embodiments, the third power-on-reset 306 is coupled to the low-voltage (LV) supply pads 126 of the third power domain 106 (PD2_LV Supply).

In the power-on-reset circuit 300, by selectively closing and opening the first switch 308 and the second switch 310, each low-voltage (LV) supply from the three different power domains can be individually ramped down while keeping the other low-voltage (LV) supplies stable. Ramping down the individual low-voltage (LV) supply and monitoring the value at the GPIO pad 318, allows the trip point detection for the power-on-reset for the third power domain 106.

In embodiments, to test the power-on-reset for the third power domain 106, the first switch 308 (i.e., the low-power switch 118 in system-on-chip 100) is configured to be in the closed position, and the second switch 310 (i.e., the RUN mode switches 120, 122, and 124 in system-on-chip 100) is configured to be in the open position. Thus, the third power-on-reset 306 is coupled to the low-voltage (LV) supply pads 126 of the PD2_LV Supply.

In this configuration, PD2_LV Supply is decoupled from PD0_LV Supply and PD1_LV Supply, while PD0_LV supply is coupled to the PD1_LV Supply—the PD0_LV Supply is provided from the low-voltage (LV) supply pad 130 for the first and second power domains.

It is noted that the outputs of the first power-on-reset 302 and the second power-on-reset 304 are kept stable, with an output of "1". Thus, the output of the AND gate 312 depends solely on the output of the third power-on-reset 306 which depends on the PD2_LV Supply voltage level provided from low-voltage supply pads 126.

Further, each level shifter 314 and 316 has a first input coupled to the PD2_LV Supply and a second input coupled to the high-voltage (HV) supply. During the power-on-reset test for the third power domain 106, the value at the third input of the second level shifter 316 is forced to "0".

Initially, when the PD2_LV Supply is above the power-on-reset threshold of the third power domain 106, the control signal (PWR_OK) at the output of the first level shifter 314 has a value equal to "1". In response to the control signal (PWR_OK) being activated (i.e., equal to "1"), the GPIO pad 318 is operable and equal to the value forced at the third input of the second level shifter 316 or "0".

Next, the PD2_LV Supply is ramped down (i.e., by ramping down the voltages at power supply pad 126), while PD0_LV Supply is kept stable. In response to the PD2_LV Supply dropping below the power-on-reset threshold of the third power domain 106, the control signal (PWR_OK) at the output of the first level shifter 314 changes from "1" to "0". As a result, the GPIO pad 318 is pulled up-transitioning from the value "0" to the value of "1". Thus, by monitoring the GPIO pad 318 and detecting the transition from "0" to "1", the trip point for the power-on-reset of the third power domain 106 is detected.

FIG. 4 illustrates a block diagram of an embodiment power-on-reset circuit 400 for testing the power-on-reset trip-point of the second power domain 104 of a system-on-chip with a multi-power domain architecture operating under a dual power flow mode. Power-on-reset circuit 400 includes a first power-on-reset 302, a second power-on-reset 304, a first switch 406, a second switch 408, a first level shifter 410, a second level shifter 412, and a GPIO pad 414, which may (or may not) be arranged as shown. Power-on-reset circuit 400 may include additional components not shown.

Power-on-reset circuit 400 allows the detection of the trip point of the power-on-reset of the second power domain 104 by monitoring the GPIO pad 414. In embodiments, the first switch 406 is mapped to the low-power switch 118 in the system-on-chip 100. In embodiments, the second switch 408 is mapped to the RUN mode switches 120, 122, and 124 in the system-on-chip 100. It is noted that, although multiple RUN mode switches are shown in FIG. 1, the number of switches is reduced to one in FIG. 4 for simplicity of the discussion.

As the PD2_LV Supply is ramped down (the third power domain 106 is powered off), to test the power-on-reset for the second power domain 104 (e.g., testing power domains that don't have a dedicated supply), and the first power domain 102 and the second power domain 104 are powered on. The input to the second power-on-reset 304 is initially coupled to the PD0_LV Supply by closing the first switch 406. Further, each level shifter 410 and 412 has a first input coupled to the PD0_LV Supply and a second input coupled to the high-voltage (HV) supply.

In this initial configuration, the control signal (PWR_OK) at the output of the first level shifter 410 has a value equal to "1". The value at the third input of the second level shifter 412 is equal to the output of the second power-on-reset 304. The output of the second power-on-reset 304 depends on the PD1_LV supply at the first switch 406 output driven from the PD0_LV Supply voltage level provided from low-voltage (LV) supply pad 130 through the first switch 406. In response to the control signal (PWR_OK) being activated (i.e., equal to "1"), the value at the GPIO pad 414 is equal to the value at the third input of the second level shifter 412 or "1".

It is noted that the second switch 408 (e.g., RUN mode switches 120, 122, and 124) is in the open position. Next, first switch 406 (e.g., low-power switch 118) is configured to be in the open position and the value at the third input of the second level shifter 412 is equal to the PD1_LV Supply, which gets ramped down automatically as switches 406 and 408 remain open while the second power domain 104 is decoupled from the low-voltage (LV) supply pads of the first power domain 102 and the third power domain 106. The control signal (PWR_OK) at the output of the first level shifter 410 remains at "1" as the PD0_LV Supply remains available and stable. In response to the PD1_LV Supply at the third input of the second level shifter 412 dropping below the power-on-reset threshold of the second power domain 104, the logic value at the GPIO pad 414 transitions from "1" to "0". Thus, by monitoring the GPIO pad 414 and detecting the transition from "1" to "0", the trip point for the power-on-reset of the second power domain 104 is detected.

FIG. 5 illustrates a block diagram of an embodiment power-on-reset circuit 500 for testing the power-on-reset trip-point of the first power domain 102 of a system-on-chip with a multi-power domain architecture operating under a dual power flow mode. Power-on-reset circuit 500 includes a first power-on-reset 302, a first switch 504, a second switch 506, a first level shifter 508, a second level shifter 510, and a GPIO pad 512, which may (or may not) be arranged as shown. Power-on-reset circuit 500 may include additional components not shown.

Power-on-reset circuit 500 allows the detection of the trip point of the power-on-reset of the first power domain 102 by monitoring the GPIO pad 512. In embodiments, the first switch 504 is mapped to the low-power switch 118 in the system-on-chip 100. In embodiments, the second switch 506 is mapped to the RUN mode switches 120, 122, and 124 in the system-on-chip 100. It is noted that, although multiple RUN mode switches are shown in FIG. 1, the number of switches is reduced to one in FIG. 5 for simplicity of the discussion.

Initially, PD2_LV Supply and PD1_LV Supply are powered off. The input to the first power-on-reset 302 is coupled to the low-voltage (LV) supply pad 130 of the first power domain 102 (PD0_LV Supply) and isolated from other power supplies by opening switches 504 and 506. Further, each level shifter 508 and 510 has a first input coupled to the PD0_LV Supply and a second input coupled to the high-voltage (HV) supply. During the power-on-reset test for the first power domain 102, the value at the third input of the second level shifter 510 is forced to "0".

In the initial configuration, as the PD0_LV Supply is above the power-on-reset threshold of the first power domain 102, the control signal (PWR_OK) at the output of the first level shifter 508 has a value equal to "1". In response to the control signal (PWR_OK) being activated (i.e., equal to "1"), the value at the GPIO pad 512 is equal to the value at the third input of the second level shifter 510 or "0".

Next, the PD0_LV Supply is ramped down. In response to the PD0_LV Supply dropping below the power-on-reset threshold of the first power domain 102, the control signal (PWR_OK) at the output of the first level shifter 508 transitions from a value of "1" to "0". As a result, the GPIO pad 512 is pulled up—transitioning from the value "0" to the value of "1". Thus, by monitoring the GPIO pad 512 and detecting the transition from "0" to "1", the trip point for the power-on-reset of the first power domain 102 is detected.

Figure 6:
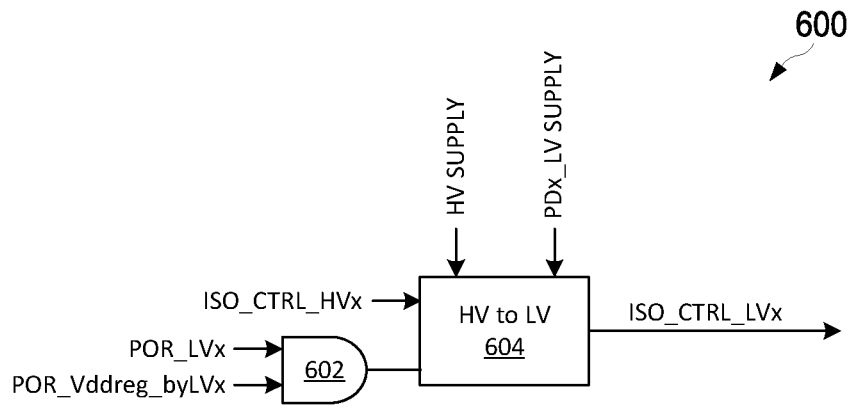
FIG. 6 is a block diagram of an embodiment circuit for generating the isolation control for the signals crossing from an unpowered domain to the power domain.

FIG. 6 illustrates a block diagram of an embodiment circuit 600 for generating the isolation control signal (i.e., gating control signal) for the signals crossing from an unpowered domain to the power domain and used in, for example, circuits 300, 400, and 500. Circuit 600 includes an AND gate 602 coupled to a level shifter 604, which may (or may not) be arranged as shown. Additionally, circuit 600 may include additional components not shown.

Circuit 600 is shown as a generic circuit where "x" represents the power domain. In embodiments, each power domain includes a dedicated circuit 600 to generate a respective isolation control signal (ISO_CTRL_LVx) (i.e., gating control signal) for signals entering its power domain from other power domains. The isolation control signal (i) allows signals from another power domain in response to the other power domain being powered and (ii) forces signals from another power domain to a safe state (i.e., logic off state—whether it is "0" or "1") in response to the other power domain being unpowered.

In embodiments, in response to (i) the first power domain 102 being unpowered, (ii) the second power domain 104 being unpowered, (iii) the third power domain 106 being powered, and (iv) the isolation control signal (ISO_CTRL_LV2) being at a logic low, all signals from the second power domain 104 and the first power domain 102 entering the third power domain 106, are forced to the logic off state (i.e., blocked) for that respective signal within the third power domain 106. This configuration corresponds to, for example, the boot sequence in a dual power flow.

In embodiments, in response to (i) the first power domain 102 being powered, (ii) the second power domain 104 being powered, (iii) the third power domain 106 being powered, and (iv) the isolation control signal (ISO_CTRL_LV2) being at a logic high, all signals from the second power domain 104 and the first power domain 102 entering the third power domain 106 are allowed to enter to the third power domain 106.

In embodiments, in response to (i) the first power domain 102 being unpowered, (ii) the third power domain 106 being unpowered, (iii) the second power domain 104 being powered, and (iv) the isolation control signal (ISO_CTRL_LV1) being at a logic low, all signals from the third power domain 106 and the first power domain 102 entering the second power domain 104, are forced to the logic off state (i.e., blocked) for that respective signal within the second power domain 104. This configuration corresponds to, for example, a low-power mode or the boot sequence in a dual power flow.

In embodiments, in response to (i) the first power domain 102 being powered, (ii) the third power domain 106 being powered, (iii) the second power domain 104 being powered, and (iv) the isolation control signal (ISO_CTRL_LV1) being at a logic high, all signals from the third power domain 106 and the first power domain 102 entering the second power domain 104 are allowed to enter to the second power domain 104.

In embodiments, in response to (i) the second power domain 104 being unpowered, (ii) the third power domain 106 being unpowered, (iii) the first power domain 102 being powered, and (iv) the isolation control signal (ISO_CTRL_LV0) being at a logic low, all signals from the third power domain 106 and the second power domain 104 entering the first power domain 102, are forced to the logic off state (i.e., blocked) for that respective signal within the first power domain 102. This configuration corresponds to, for example, a standby mode.

In embodiments, in response to (i) the first power domain 102 being powered, (ii) the third power domain 106 being powered, (iii) the second power domain 104 being powered, and (iv) the isolation control signal (ISO_CTRL_LV0) being at a logic high, all signals from the third power domain 106 and the second power domain 104 entering the first power domain 102 are allowed to enter to the first power domain 102.

In embodiments, the first input to the AND gate 602 is the first voltage level (POR_LVx) of the low-voltage (LV) supply in a first configuration, where the HV supply becomes available before low-voltage (LV) supplies, and where the HV supply provides for the LV supplies.

In embodiments, the second input to the AND gate 602 is the second voltage level (POR_Vddreg_byLV) of the low-voltage (LV) supply in a second configuration, where the HV supply becomes available after the low-voltage (LV) supplies, the HV supply does not provide the LV supplies, and the voltage for the LV supplies are provided externally.

Level shifter 604 is a high-voltage (HV) to low-voltage (LV) level shifter. The first transistor input of the level shifter 604 is coupled to the high-voltage (HV) supply.

In an embodiment, to generate the isolation control signal (ISO_CTRL_LV0) (i.e., isolation control of the signals entering the first power domain 102) to the first power domain 102, the second transistor input of the level shifter 604 is coupled to the first power-on-reset 302 output.

In another embodiment, to generate the isolation control signal (ISO_CTRL_LV1) (i.e., isolation control of the signals entering the second power domain 104) to the second power domain 104, the second transistor input of the level shifter 604 is coupled to the second power-on-reset 304 output.

In yet another embodiment, to generate the isolation control signal (ISO_CTRL_LV2) (i.e., isolation control of the signals entering third power domain 106) to the third power domain 106, the second transistor input of the level shifter 604 is coupled to the third power-on-reset 306 output.

Thus, depending on the power-on-reset and the PDx_LV_SUPPLY, the level shifter 604 level shifts the ISO_CTRL_HVx (i.e., from the HV supply level of the first power domain 102) to ISO_CTRL_LVx (i.e., to the associated LV supply level of that particular power domain). The level-shifted isolation control signal (ISO_CTRL_LVx) is used as the isolation control (i.e., gating control) of the signals entering that particular power domain from other power domains.

In embodiments, the level-shifted isolation control signal (ISO_CNTRL_LVx) is forced to a logic high "1" when the output of the AND gate 602 is at a logic high "1". Thus, the associated LV supply level of that particular power domain is set above the corresponding power-on-reset threshold.

In embodiments, the level-shifted isolation control signal (ISO_CONTRL_LVx) is forced to a logic low "0" when the output of the AND gate 602 is at a logic low "0". Thus, the associated LV supply level of that particular power domain is set below the corresponding power-on-reset threshold.

Figure 7:
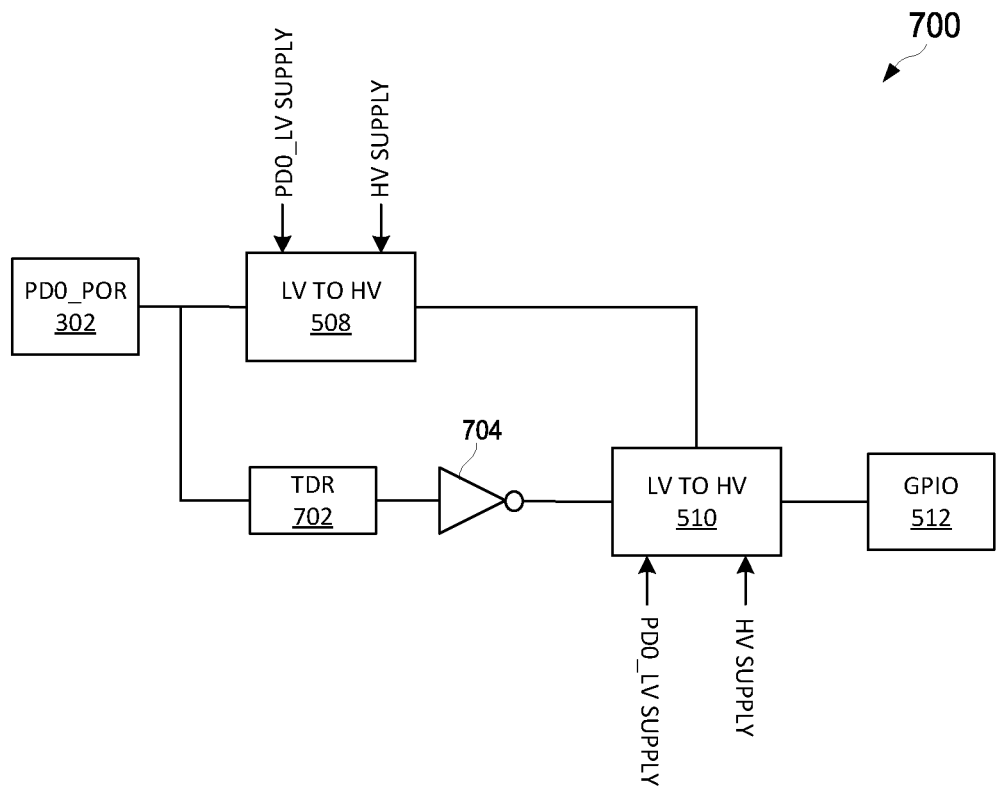
FIG. 7 is a block diagram of an embodiment circuit used to illustrate how the input value to the third input of the second level shifter is forced to the value of "0"

FIG. 7 illustrates a block diagram of an embodiment circuit 700 used to illustrate how the input value to the third input of the second level shifter 510 is forced to the value of "0". Circuit 700 includes the power-on-reset 302, a test data register (TDR) 702, the first level shifter 508, an inverter 704, the second level shifter 510, and the GPIO pad 512, which may (or may not) be arranged as shown. Circuit 700 may include additional components not shown.

In embodiments, during the power-on-reset test mode, the test data register 702 is loaded with a value of "1". Therefore, the output of inverter 704 is set to the value of "0". Thus, the third input to the second level shifter 510 is forced to the value of "0". It is noted that the test data register 702 is reset to "0" when the power-on-reset test is not being performed. In embodiments, the test data register 702 is reset or loaded with the value of "1" using a JTAG.

Figure 8:
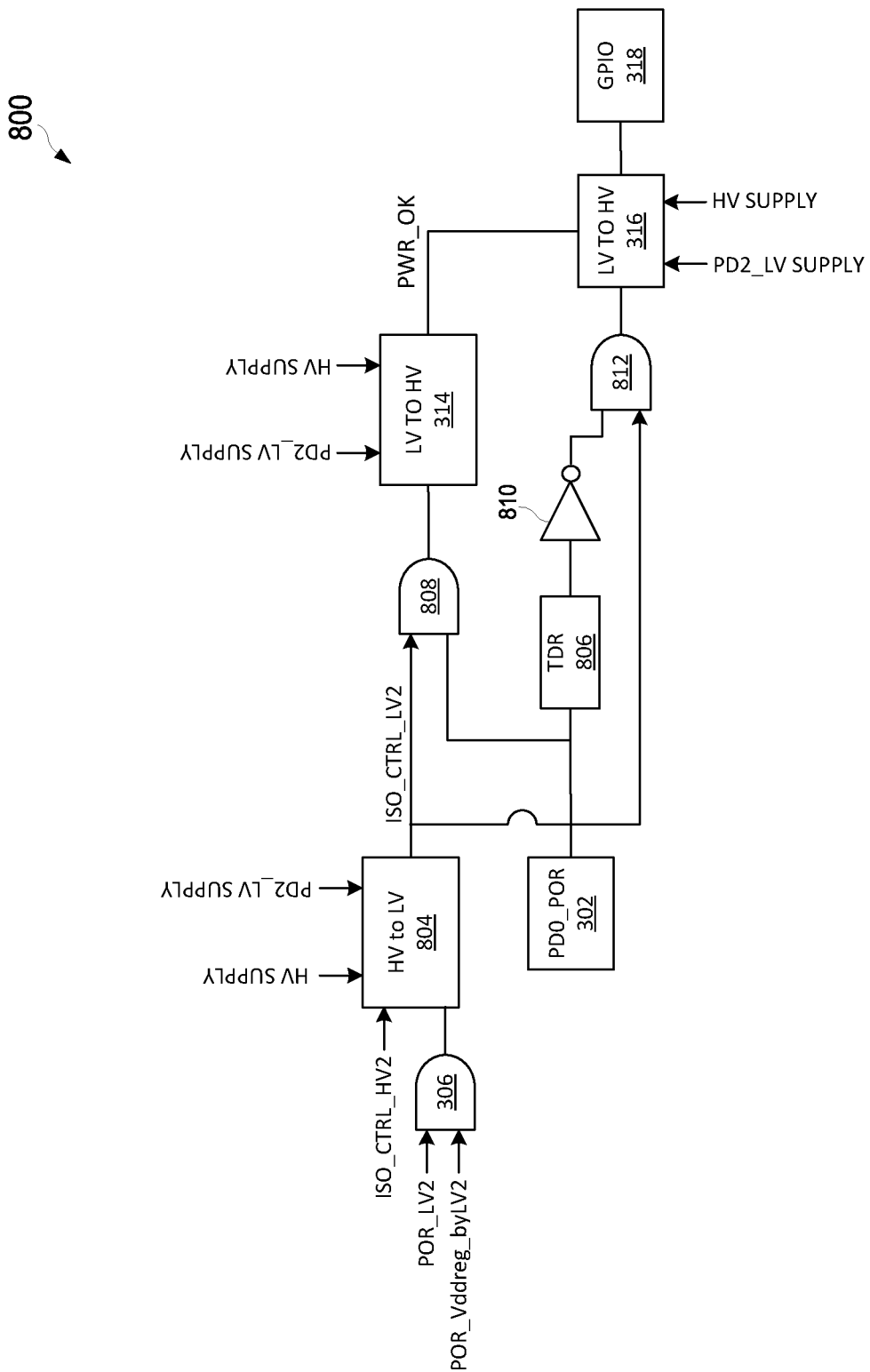
FIG. 8 is a block diagram of an embodiment circuit used to illustrate the input value to the third input of the second level shifter.

FIG. 8 illustrates a block diagram of an embodiment circuit 800 used to illustrate the input value to the third input of the second level shifter 316. Circuit 800 includes a first AND gate 306 (i.e., the third power-on-reset 306), an HV to LV level shifter 804, a test data register (TDR) 806, a second AND gate 808, an inverter 810, a third AND gate 812, the first level shifter 314, the second level shifter 316, and the GPIO pad 318, which may (or may not) be arranged as shown. Further, circuit 800 may include additional components not shown.

First AND gate 306 (third power-on-reset) and the HV to LV level shifter 804 are arranged as circuit 600. The output signal (ISO_CTRL_LV2) corresponds to the value ISO_CTRL_HV2 and the value at the output of first AND gate 306 (the third power-on-reset 306 output).

In embodiments, the input to the first level shifter 314 is the output of the second AND gate 808. The output of the second AND gate 808 corresponds to the values of the first power-on-reset 302 output, the value at ISO_CTRL_HV2, and the value at the third power-on-reset 306 output.

As the value at first power-on-reset 302 is high during the testing of the power-on-reset of the third power domain 106, also the ISO_CTRL_HV2 is at a logic high "1" (i.e., as the HV supply is stable), the output of the AND gate 808 corresponds to the value of isolation control signal (ISO_CTRL_LV2) from the HV to LV level shifter 804. The value of isolation control signal (ISO_CTRL_LV2) is an AND logic of low-voltage power-on-resets monitoring the supplies (PD2_LV SUPPLY) from low-voltage (LV) supply pads 126, as detailed in FIG. 6 for the third power domain 106.

The input to the second level shifter 316 is the AND logic of the isolation control signal (ISO_CTRL_LV2) and the inverted value loaded at the test data register 806. During the testing of the power-on-reset of the third power domain 106, the test data register 806 is loaded with a value of "1". Thus, the value of the third input to the second level shifter 316 is forced to "0".

Figure 9:
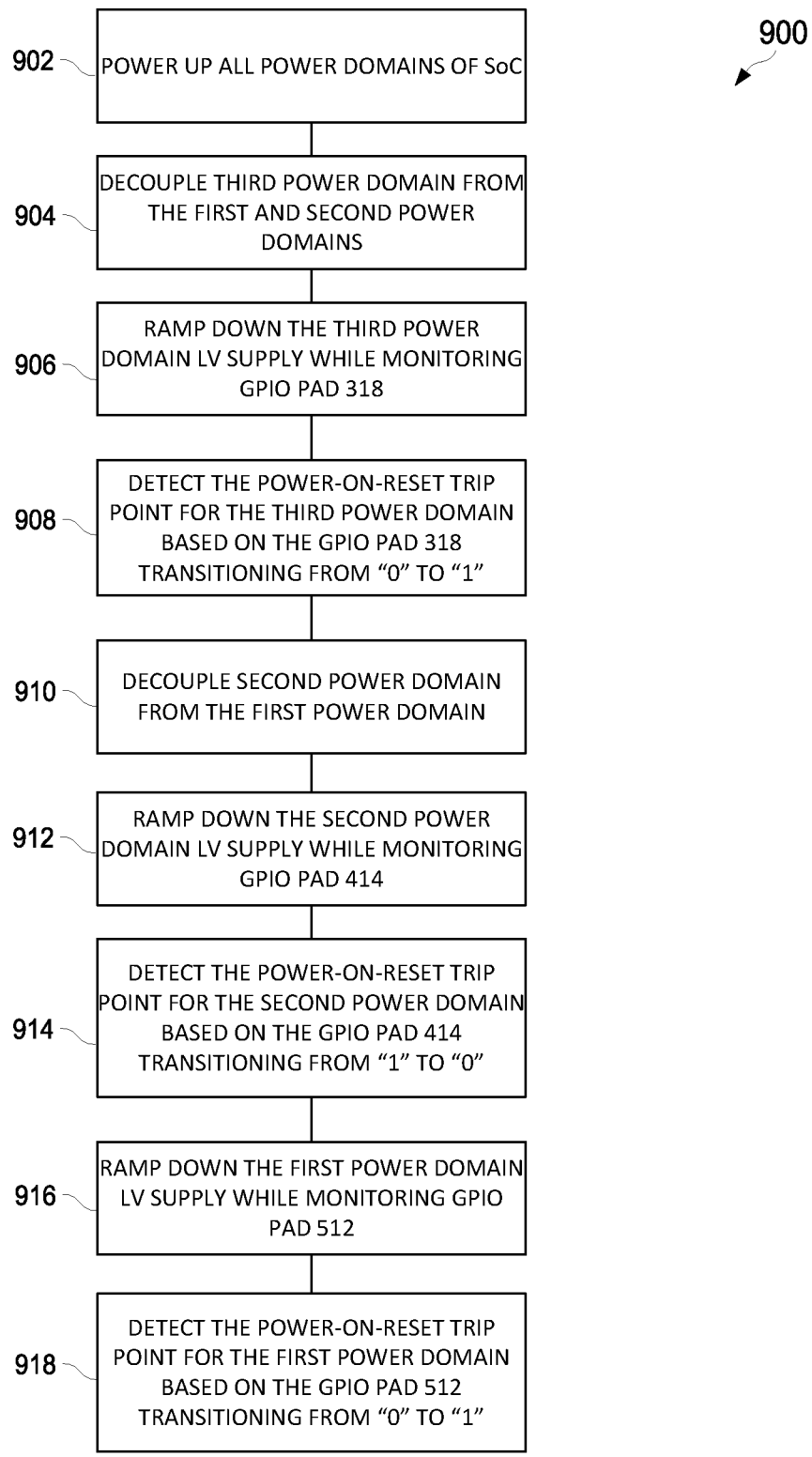
FIG. 9 is a flow chart of an embodiment method to test power-on-resets of a system-on-chip with a multi-power domain architecture operating under a dual power flow mode.

FIG. 9 illustrates a flow chart of an embodiment method 900 to test power-on-resets of a system-on-chip with a multi-power domain architecture operating under a dual power flow mode.

At step 902, the system-on-chip is fully powered up, low-power switch 118 and RUN mode switches 120, 122, and 124 are closed. The test data register 702 and 806 are reset to "0". The output of the control signals (PWR_OK) for the various power domains have a value equal to "1" when both the HV and LV supplies are available.

At step 904, the testing of the power-on-reset of the third power domain 106 begins. The test data register 806 is loaded with the value of "1". The third power domain 106 is decoupled from the first power domain 102 and the second power domain 104 by opening the RUN mode switches 120, 122, and 124.

At step 906, the low-voltage (LV) supply of the third power domain 106 (PD2_LV Supply) is ramped down and the GPIO pad 318 is monitored. Before the PD2_LV Supply is ramped down, the value at the GPIO pad 318 is "0".

At step 908, while PD2_LV Supply is ramping down, in response to detecting a transition from "0" to "1" at the GPIO pad 318, the trip point for the power-on-reset of the third power domain 106 is detected.

At step 910, the second power domain 104 is decoupled from the first power domain 102 by opening the low-power switch 118.

At step 912, the low-voltage (LV) supply of the second power domain 104 (PD1_LV Supply) is ramped down and the GPIO pad 414 is monitored. Before the PD1_LV Supply is ramped down, the value at the GPIO pad 414 is "1".

At step 914, while PD1_LV Supply is ramping down, in response to detecting a transition from "1" to "0" at the GPIO pad 414, the trip point for the power-on-reset of the second power domain 104 is detected.

At step 916, the low-voltage (LV) supply of the first power domain 102 (PD0_LV Supply) is ramped down and the GPIO pad 512 is monitored. Before the PD0_LV Supply is ramped down, the value at the GPIO pad 512 is "0".

At step 918, while PD0_LV Supply is ramping down, in response to detecting a transition from "0" to "1" at the GPIO pad 512, the trip point for the power-on-reset of the first power domain 102 is detected.

Figure 10:
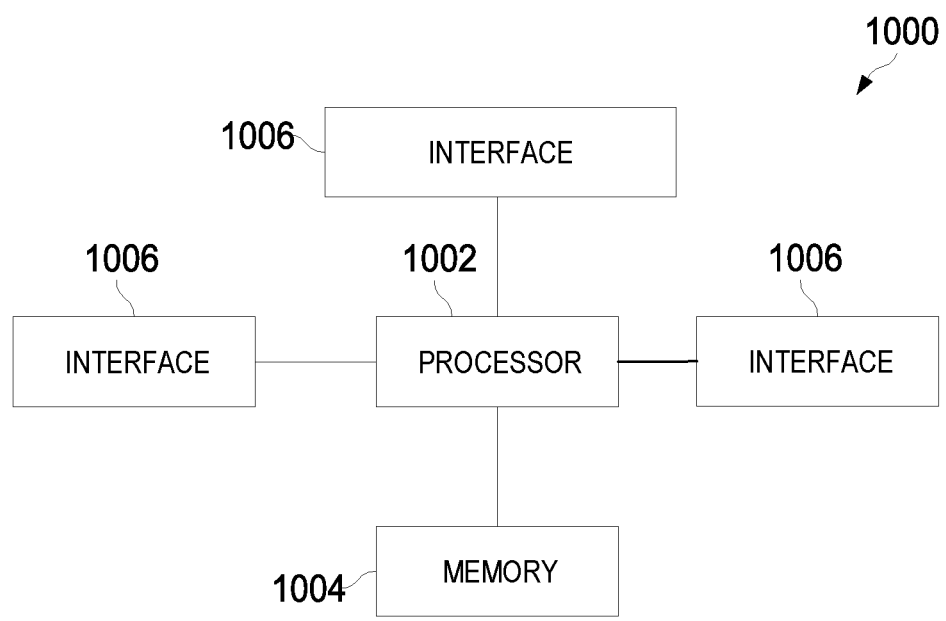
FIG. 10 is a block diagram of an embodiment processing system.

FIG. 10 illustrates a block diagram of an embodiment processing system 1000. As shown, the processing system 1000 includes a processor 1002, a memory 1004, and an interface 1006, which may (or may not) be arranged as shown. In embodiments, the processing system 1000 may be coupled to the system-on-chip 100 for testing the various power-on-resets of the various power domains. In embodiments, controller 108 corresponds to the processing system 1000.

The processing system 1000 may include additional components not depicted, such as long-term storage (e.g., non-volatile memory, etc.), measurement devices, and the like.

Processor 1002 may be any component or collection of components adapted to perform computations or other processing related tasks, as disclosed herein. Memory 1004 may 1004 may be any component or collection of components adapted to store programming or instructions for execution by the processor 1002. In an embodiment, memory 1004 includes a non-transitory computer-readable medium.

Interface 1006 may be any component or collection of components that allow the processor 1002 to communicate with other devices/components or a user. For example, interface 1006 may be adapted to allow a user or device (e.g., personal computer (PC), etc.) to interact/communicate with the processing system 1000.

Figure 11:
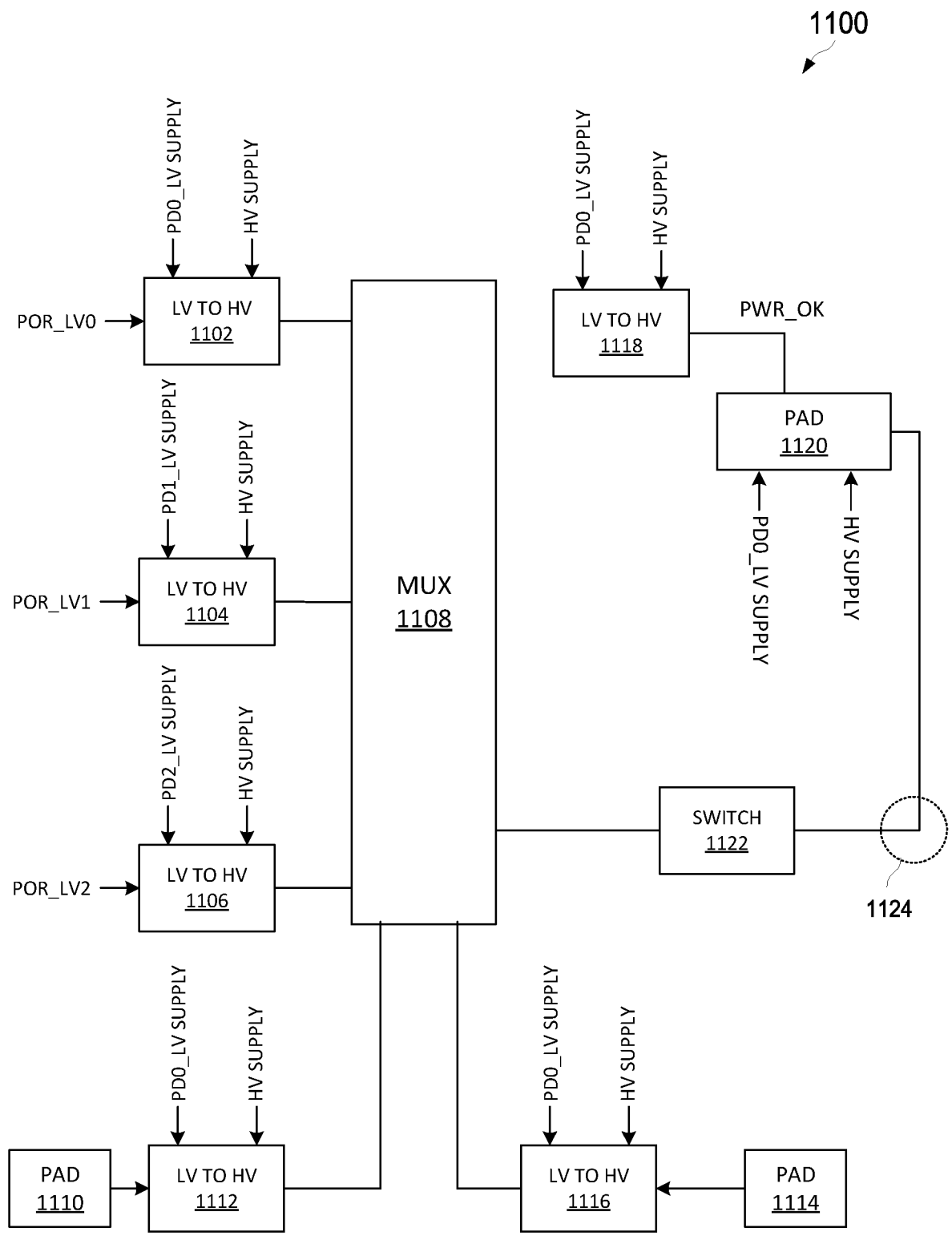
FIG. 11 is a block diagram of an embodiment circuit for testing power-on-resets of a system-on-chip with a multi-power domain architecture operating under a dual power flow mode.

FIG. 11 illustrates a block diagram of an embodiment circuit 1100 for testing power-on-resets of a system-on-chip with a multi-power domain architecture operating under a dual power flow mode. Circuit 1100 includes a first level shifter 1102, a second level shifter 1104, a third level shifter 1106, a multiplexer 1108, a first pad 1110, a fourth level shifter 1112, a second pad 1114, a fifth level shifter 1116, a sixth level shifter 1118, a third pad 1120, and a switch 1122, which may (or may not) be arranged as shown. Further, circuit 1100 may include additional components not shown. A probe point within the die is shown as element 1124 at the output of the third pad 1120.

The inputs of the first level shifter 1102, the second level shifter 1104, and the third level shifter 1106 are, respectively, coupled to a representative logic value of the low-voltage supply of the first power domain (POR_LV0), the low-voltage supply of the second power domain (POR_LV1), and the low-voltage supply of the third power domain (POR_LV2).

The outputs of the first level shifter 1102, the second level shifter 1104, and the third level shifter 1106 are coupled to the multiplexer 1108.

The first pad 1110 and the second pad 1114 are pads in the first power domain. Based on the values at the first pad 1110 and the second pad 1114 (configured in test mode to operate as power-on-reset test control pads), the multiplexer 1108 selects the output of one of the level shifters.

Initially, the system-on-chip is fully powered up and the low-power switch 118 and the RUN mode switches 120, 122, and 124 are in a closed position. A test data register coupled to the input of the third pad 1120 through an inverter is reset at "0"—the value at the third pad 1120 is "1". The outputs of the first pad 1110 and the second pad 1114 are set to "0".

During the power-on-reset test mode, the test data register is loaded with a value of "1" using, for example, a JTAG. To test the power-on-reset for the low-voltage supply of the third power domain 106, the first pad 1110 and the second pad 111 are forced to "01", which results in the multiplexer 1108 selecting the low-voltage power-on-reset monitoring the supply of the third power domain 106 at its output. The third power domain 106 is decoupled from the first power domain 102 and the second power domain 104 by opening the RUN mode switches 120, 122, and 124. The low-voltage supply of the third power domain 106 is ramped down. In response to the low-voltage supply of the third power domain 106 reaching the power-on-reset threshold of the third power domain 106, the third pad 1120 transitions from "1" to "0". The transition point is the power-on-reset trip point of the low-voltage supply of the third power domain 106.

Next, to test the power-on-reset for the low-voltage supply of the second power domain 104, the first pad 1110 and the second pad 1114 are forced to "10", which results in the multiplexer 1108 selecting the low-voltage power-on-reset monitoring the supply of the second power domain 104 at its output. The second power domain 104 is decoupled from the first power domain 102 by opening the low-power switch 118. The low-voltage supply of the second power domain 104 is ramped down. In response to the low-voltage supply of the second power domain 104 reaching the power-on-reset threshold of the second power domain 104, the third pad 1120 transitions from "1" to "0". The transition point is the power-on-reset trip point of the low-voltage supply of the second power domain 104.

Finally, to test the power-on-reset for the low-voltage supply of the first power domain 102, the first pad 1110 and the second pad 1114 are forced to "11", which results in the multiplexer 1108 selecting the low-voltage power-on-reset monitoring the supply of the first power domain 102 at its output. The low-voltage supply of the first power domain 102 is ramped down. In response to the low-voltage supply of the first power domain 102 reaching the power-on-reset threshold of the first power domain 102, the third pad 1120 transitions from "0" to "1". The transition point is the power-on-reset trip point of the low-voltage supply of the first power domain 102.

A similar circuit to circuit 1100 can be used to test other power-on-resets of the various power domains. For example, in embodiments, the inputs of the first level shifter 1102, the second level shifter 1104, and the third level shifter 1106 are, respectively, coupled to a representative logic value of the low-voltage supply of the first power domain (POR_Vddreg_byLV0), the low-voltage supply of the second power domain (POR_Vddreg_byLV0), and the low-voltage supply of the third power domain (POR_Vddreg_byLV0), as discussed in the discussion for the circuit 600.

It is noted that all steps outlined are not necessarily required and can be optional. Further, changes to the arrangement of the steps, removal of one or more steps and path connections, and addition of steps and path connections are similarly contemplated.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A method for testing multiple power-on-resets in a system-on-chip with a multi-power domain architecture operating under a dual power flow mode, the method comprising:
   powering up the system-on-chip to full power mode;
   decoupling a third power domain from a first power domain and a second power domain;
   monitoring a general purpose input/output (GPIO) pad of the third power domain during a ramping down of a supply of the third power domain; and
   detecting a logic transition at the GPIO pad of the third power domain corresponding to a trip-point of the power-on-reset of the third power domain.

2. The method of claim 1, further comprising:
   decoupling the second power domain from the first power domain;
   monitoring a GPIO pad of the first power domain during a ramping down of a supply of the second power domain; and
   detecting a logic transition at the GPIO pad of the first power domain corresponding to a power-on-reset trip-point of the second power domain.

3. The method of claim 2, further comprising:
   monitoring a second GPIO pad of the first power domain during a ramping down of a supply of the first power domain; and
   detecting a logic transition at the second GPIO pad of the first power domain corresponding to a trip-point of the power-on-reset of the first power domain.

4. The method of claim 1, wherein a supply of the second power domain and a supply of the first power domain remain stable during the ramping down of the supply of the third power domain.

5. The method of claim 1, wherein the system-on-chip with the multi-power domain architecture operating under dual power flow mode has a first power flow direction during a power up or a reset sequence different from a second power flow direction during an exiting of a standby mode.

6. The method of claim 5, wherein the first power flow direction is a sequential powering up of the third power domain, the second power domain, and the first power domain.

7. The method of claim 6, wherein the second power flow direction is a sequential powering up of the second power domain and the third power domain, wherein the first power domain remains on during the standby mode.

8. The method of claim 1, wherein the third power domain is used to perform full-power operations of the system-on-chip, wherein the second power domain is used to perform low-power operations of the system-on-chip, and wherein the first power domain is used to enter the system-on-chip into a standby mode.

9. A system-on-chip, comprising:
   a first power domain for operating the system-on-chip in a standby mode, the first power domain comprising a first switch;
   a second power domain for operating the system-on-chip in a low-power mode, the first switch configured to couple the first power domain to the second power domain, the second power domain comprising a second switch;
   a third power domain for operating the system-on-chip in a full operation mode, the second switch configured to couple the third power domain to the second power domain and the first switch configured to couple the second power domain to the first power domain, the third power domain comprising:
      a first level shifter configured to:
         generate a control signal with a logic level high in response to a supply of the third power domain being greater than a first threshold, the system-on-chip being fully powered up, and the second switch being in an open position, and
         generate the control signal with a logic level low in response to the supply of the third power domain being less than the first threshold, the system-on-chip being powered up in the first power domain and the second power domain and unpowered in the third power domain, and the second switch being in the open position; and a second level shifter configured to:
receive the control signal,
generate an output signal with a logic level low in response to the control signal having a logic level high, and
generate the output signal with a logic level high in response to the control signal having a logic level low.

10. The system-on-chip of claim 9, further comprising a GPIO pad coupled to an output of the second level shifter, wherein by monitoring a transition from the logic level low to a logic level high at the GPIO pad during a ramping down of the supply of the third power domain, a power-on-reset trip point of the supply of the third power domain is detected.

11. The system-on-chip of claim 9, wherein the second power domain comprises a third level shifter configured to:
generate a second output signal with a logic level high in response to a supply of the second power domain being greater than a second threshold, and
generate the second output signal with a logic level low in response to the supply of the second power domain being less than the second threshold.

12. The system-on-chip of claim 11, further comprising a GPIO pad coupled to an output of the third level shifter, wherein by monitoring a transition from the logic level high to a logic level low at the GPIO pad during a ramping down of the supply of the second power domain, a power-on-reset trip point of the supply of the second power domain is detected.

13. The system-on-chip of claim 11, wherein the first power domain comprises:
a fourth level shifter configured to:
generate a second control signal with a logic level high in response to a power-on-reset of the first power domain being greater than a third threshold, and
generate the second control signal with a logic level low in response to the power-on-reset of the first power domain being less than the third threshold; and
a fifth level shifter configured to:
receive the second control signal,
generate a third output signal with a logic level low in response to the second control signal having a logic level high, and
generate the third output signal with a logic level high in response to the second control signal having a logic level low.

14. The system-on-chip of claim 13, further comprising a GPIO pad coupled to an output of the fifth level shifter, wherein by monitoring a transition from the logic level low to a logic level high at the GPIO pad during a ramping down of the supply of the first power domain, a power-on-reset trip point of the supply of the first power domain is detected.

15. A method for testing multiple power-on-resets in a system-on-chip with a multi-power domain architecture operating under a dual power flow mode, the method comprising:
having a first power domain for operating the system-on-chip in a standby mode, the first power domain comprising a first switch;
having a second power domain for operating the system-on-chip in a low-power mode, the first power domain couplable to the second power domain using the first switch, and the second power domain comprising a second switch;
a third power domain for operating the system-on-chip in a full operation mode, the third power domain couplable to the second power domain using the second switch and further couplable to the first power domain using the first switch;
operating the system-on-chip in a power-on-reset test mode;
opening the second switch to decouple the third power domain from the first power domain and the second power domain during full power up of the system-on-chip;
loading a test data register with a bit having a logic level high;
ramping down of a supply of the third power domain; and
detecting a logic level transition at an output of a first level shifter, the first level shifter coupled to an inverted value of the test data register and controlled by a control signal generated by a second level shifter, the second level shifter generating a first control signal in response to the supply of the third power domain being greater than a threshold and generating a second control signal in response to the supply of the third power domain being less than the threshold.

16. The method of claim 15, wherein the detecting the logic level transition at the output of the first level shifter corresponds to a power-on-reset trip point of the supply of the third power domain.

17. The method of claim 15, further comprising:
opening the first switch to decouple the second power domain from the first power domain;
ramping down of a supply of the second power domain; and
detecting a logic level transition at an output of a third level shifter, the third level shifter generating a first output signal with a logic level high in response to the supply of the second power domain being greater than a second threshold and generating a second output signal with a logic level low in response to the supply of the second power domain being less than the second threshold.

18. The method of claim 17, wherein the detecting the logic level transition at the output of the third level shifter corresponds to a power-on-reset trip point of the supply of the second power domain.

19. The method of claim 17, further comprising:
loading a second test data register with a bit having a logic level high;
ramping down of a supply of the first power domain; and
detecting a logic level transition at an output of a fourth level shifter, the fourth level shifter coupled to an inverted value of the second test data register and controlled by a third control signal generated by a fifth level shifter, the fifth level shifter generating a fourth control signal in response to the supply of the first power domain being greater than a third threshold and generating a fifth control signal in response to the supply of the first power domain being less than the third threshold.

20. The method of claim 19, wherein the detecting the logic level transition at the output of the fourth level shifter corresponds to a power-on-reset trip point of the supply of the first power domain.

* * * * *